United States Patent
Lee et al.

(10) Patent No.: US 12,139,642 B2
(45) Date of Patent: Nov. 12, 2024

(54) CMP SLURRY COMPOSITION FOR POLISHING TUNGSTEN PATTERN WAFER AND METHOD OF POLISHING TUNGSTEN PATTERN WAFER USING THE SAME

(71) Applicant: SAMSUNG SDI CO., LTD., Yongin-si (KR)

(72) Inventors: Eui Rang Lee, Suwon-si (KR); Yoon Young Koo, Suwon-si (KR); Won Jung Kim, Suwon-si (KR); Hyeong Mook Kim, Suwon-si (KR); Tae Won Park, Suwon-si (KR); Jong Won Lee, Suwon-si (KR); Youn Jin Cho, Suwon-si (KR)

(73) Assignee: SAMSUNG SDI CO., LTD., Yongin-si (KR)

( * ) Notice: Subject to any disclaimer, the term of this patent is extended or adjusted under 35 U.S.C. 154(b) by 302 days.

(21) Appl. No.: 17/379,133

(22) Filed: Jul. 19, 2021

(65) Prior Publication Data
US 2022/0025214 A1    Jan. 27, 2022

(30) Foreign Application Priority Data

Jul. 22, 2020    (KR) .................. 10-2020-0091278

(51) Int. Cl.
| | | |
|---|---|---|
| *C09G 1/02* | (2006.01) | |
| *A01N 33/20* | (2006.01) | |
| *A01N 37/34* | (2006.01) | |
| *H01L 21/321* | (2006.01) | |

(52) U.S. Cl.
CPC ............... *C09G 1/02* (2013.01); *A01N 33/20* (2013.01); *A01N 37/34* (2013.01); *H01L 21/3212* (2013.01)

(58) Field of Classification Search
None
See application file for complete search history.

(56) References Cited

U.S. PATENT DOCUMENTS

| | | | | |
|---|---|---|---|---|
| 2005/0076578 | A1* | 4/2005 | Siddiqui | C09G 1/02 438/692 |
| 2010/0167545 | A1 | 7/2010 | Shi et al. | |
| 2015/0291462 | A1* | 10/2015 | Strominger | C23F 11/163 210/758 |
| 2018/0257194 | A1* | 9/2018 | Yoshizaki | H01L 21/30625 |

FOREIGN PATENT DOCUMENTS

| | | |
|---|---|---|
| CN | 1272221 A | 11/2000 |
| CN | 1576345 A | 2/2005 |
| CN | 101636465 A | 1/2010 |
| CN | 102762684 A | 10/2012 |
| CN | 106414650 A | 2/2017 |
| CN | 106661430 A | 5/2017 |
| KR | 10-2010-0074077 A | 7/2010 |
| KR | 10-2013-0025870 A | 3/2013 |
| KR | 10-2016-0138149 A | 12/2016 |
| TW | 200513526 A | 4/2005 |
| TW | 201024397 A | 7/2010 |
| TW | 201800571 A | 1/2018 |

OTHER PUBLICATIONS

Taiwanese Office Action issued on Nov. 24, 2021 in the corresponding Taiwanese Patent Application No. 110126799.
Korean Office Action issued on Jul. 11, 2023, in the corresponding Korean Patent Application No. 10-2020-0091278.
Chinese Office action dated Apr. 12, 2022.

* cited by examiner

*Primary Examiner* — Roberts P Culbert
(74) *Attorney, Agent, or Firm* — Lee IP Law, P.C.

(57) ABSTRACT

A CMP slurry composition for polishing a tungsten pattern wafer and a method of polishing a tungsten pattern wafer, the CMP slurry composition including a solvent, the solvent being a polar solvent or a non-polar solvent; an abrasive agent; and a biocide, wherein the abrasive agent includes silica modified with a silane containing two nitrogen atoms or silica modified with a silane containing three nitrogen atoms, the biocide includes a compound of Formula 3:

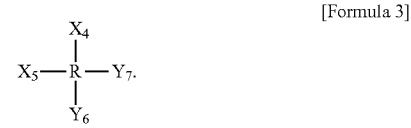

[Formula 3]

8 Claims, No Drawings

CMP SLURRY COMPOSITION FOR POLISHING TUNGSTEN PATTERN WAFER AND METHOD OF POLISHING TUNGSTEN PATTERN WAFER USING THE SAME

CROSS-REFERENCE TO RELATED APPLICATION

This application claims the benefit of Korean Patent Application No. 10-2020-0091278, filed on Jul. 22, 2020, in the Korean Intellectual Property Office, the entire disclosure of which is incorporated herein by reference.

BACKGROUND

1. Field

Embodiments relate to a chemical mechanical polishing (CMP) slurry composition for polishing a tungsten pattern wafer and a method of polishing a tungsten pattern wafer using the same.

2. Description of the Related Art

A CMP composition may be used in a method of polishing (or flattening) a surface of a substrate. A polishing composition for polishing a metal layer (e.g., a tungsten layer) on a semiconductor substrate may include abrasive particles suspended in an aqueous solution and chemical accelerators, e.g., an oxidizing agent, a catalyst, or the like.

A process of polishing a metal layer using the CMP composition may include polishing only the metal layer, polishing the metal layer and a barrier layer, or polishing the metal layer, the barrier layer, and an oxide layer. Among these steps, in the step of polishing the metal layer, the barrier layer, and the oxide layer, a composition for polishing a tungsten pattern wafer may be used, and good polishing flatness may be achieved under conditions that the metal layer and the oxide layer are polished at a suitable polishing rate.

SUMMARY

The embodiments may be realized by providing a CMP slurry composition for polishing a tungsten pattern wafer, the CMP slurry composition including a solvent, the solvent being a polar solvent or a non-polar solvent; an abrasive agent; and a biocide, wherein the abrasive agent includes silica modified with a silane containing two nitrogen atoms or silica modified with a silane containing three nitrogen atoms, the biocide includes a compound of Formula 3:

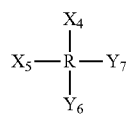

[Formula 3]

in Formula 3, R is carbon (C) or a bivalent to tetravalent organic group; $X_4$ is a halogen or a halogen-containing monovalent organic group; $X_5$ is a cyano group (—C≡N), a nitro group (—NO$_2$), a cyano group-containing monovalent organic group, or a nitro group-containing monovalent organic group; and $Y_6$ and $Y_7$ are each independently a hydrogen atom, a halogen, a cyano group, a nitro group, a hydroxyl group, a substituted or unsubstituted $C_1$ to $C_{20}$ alkyl group, a substituted or unsubstituted $C_6$ to $C_{20}$ aryl group, a substituted or unsubstituted $C_3$ to $C_{20}$ cycloalkyl group, a substituted or unsubstituted $C_7$ to $C_{20}$ arylalkyl group, a substituted or unsubstituted $C_1$ to $C_{20}$ alkoxy group, a substituted or unsubstituted $C_6$ to $C_{20}$ aryloxy group, or —C(=O)—NZ$_1$Z$_2$, in which $Z_1$ and $Z_2$ are each independently a hydrogen atom, a substituted or unsubstituted $C_1$ to $C_{20}$ alkyl group, or a substituted or unsubstituted $C_6$ to $C_{20}$ aryl group.

The compound of Formula 3 may include a compound of Formula 4:

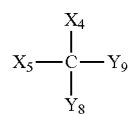

[Formula 4]

in Formula 4, $X_4$ and $X_5$ may each independently be defined the same as those of Formula 3, and $Y_8$ and $Y_9$ may each independently be a hydrogen atom, a halogen, a cyano group, a nitro group, a hydroxyl group, a substituted or unsubstituted $C_1$ to $C_{20}$ alkyl group, or —C(=O)—NZ$_1$Z$_2$ ($Z_1$ and $Z_2$ being each independently a hydrogen atom, a substituted or unsubstituted $C_1$ to $C_{20}$ alkyl group, or a substituted or unsubstituted $C_6$ to $C_{20}$ aryl group).

The compound of Formula 3 may include a compound of Formula 7, Formula 8, or Formula 9:

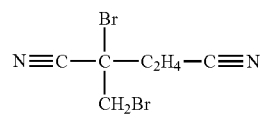

[Formula 7]

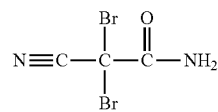

[Formula 8]

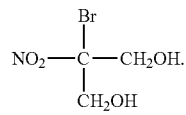

[Formula 9]

The biocide may be present in an amount of about 0.001 wt % to about 1 wt %, based on a total weight of the CMP slurry composition.

The CMP slurry composition may have a pH of about 3 to about 6.

The abrasive agent may include the silica modified with the silane containing two nitrogen atoms, the silane containing two nitrogen atoms may include a compound of Formula 1, a cation derived from the compound of Formula 1, or a salt of the compound of Formula 1:

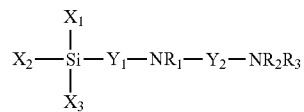

[Formula 1]

in Formula 1, $X_1$, $X_2$ and $X_3$ may each independently be a hydrogen atom, a hydroxyl group, a substituted or unsubstituted $C_1$ to $C_{20}$ alkyl group, a substituted or unsubstituted $C_6$ to $C_{20}$ aryl group, a substituted or unsubstituted $C_3$ to $C_{20}$ cycloalkyl group, a substituted or unsubstituted $C_7$ to $C_{20}$ arylalkyl group, a substituted or unsubstituted $C_1$ to $C_{20}$ alkoxy group, or a substituted or unsubstituted $C_6$ to $C_{20}$ aryloxy group, at least one of $X_1$, $X_2$ and $X_3$ being a hydroxyl group, a substituted or unsubstituted $C_1$ to $C_{20}$ alkoxy group, or a substituted or unsubstituted $C_6$ to $C_{20}$ aryloxy group; $Y_1$ and $Y_2$ may each independently be a bivalent aliphatic hydrocarbon group, a bivalent alicyclic hydrocarbon group, or a bivalent aromatic hydrocarbon group; and $R_1$, $R_2$ and $R_3$ may each independently be a hydrogen atom, a hydroxyl group, a substituted or unsubstituted $C_1$ to $C_{20}$ monovalent aliphatic hydrocarbon group, a substituted or unsubstituted $C_3$ to $C_{20}$ monovalent alicyclic hydrocarbon group, or a substituted or unsubstituted $C_6$ to $C_{30}$ monovalent aromatic hydrocarbon group.

The abrasive agent may include the silica modified with the silane containing three nitrogen atoms, the silane containing three nitrogen atoms may include a compound of Formula 2, a cation derived from the compound of Formula 2, or a salt of the compound of Formula 2:

[Formula 2]

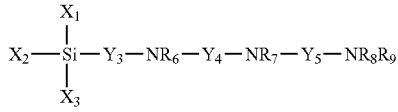

in Formula 2, $X_1$, $X_2$ and $X_3$ may each independently be a hydrogen atom, a hydroxyl group, a substituted or unsubstituted $C_1$ to $C_{20}$ alkyl group, a substituted or unsubstituted $C_6$ to $C_{20}$ aryl group, a substituted or unsubstituted $C_3$ to $C_{20}$ cycloalkyl group, a substituted or unsubstituted $C_7$ to $C_{20}$ arylalkyl group, a substituted or unsubstituted $C_1$ to $C_{20}$ alkoxy group, or a substituted or unsubstituted $C_6$ to $C_{20}$ aryloxy group, at least one of $X_1$, $X_2$ and $X_3$ being a hydroxyl group, a substituted or unsubstituted $C_1$ to $C_{20}$ alkoxy group, or a substituted or unsubstituted $C_6$ to $C_{20}$ aryloxy group; $Y_3$, $Y_4$ and $Y_5$ may each independently be a single bond, a bivalent aliphatic hydrocarbon group, a bivalent alicyclic hydrocarbon group, or a bivalent aromatic hydrocarbon group; and $R_6$, $R_7$, $R_8$ and $R_9$ may each independently be a hydrogen atom, a hydroxyl group, a substituted or unsubstituted $C_1$ to $C_{20}$ monovalent aliphatic hydrocarbon group, a substituted or unsubstituted $C_3$ to $C_{20}$ monovalent alicyclic hydrocarbon group, or a substituted or unsubstituted $C_6$ to $C_{30}$ monovalent aromatic hydrocarbon group.

The CMP slurry composition may further include an oxidizing agent, a catalyst, or an organic acid.

The CMP slurry composition may include about 0.001 wt % to about 20 wt % of the abrasive agent; about 0.001 wt % to about 1 wt % of the biocide; about 0.01 wt % to about 20 wt % of the oxidizing agent; about 0.001 wt % to about 10 wt % of the catalyst; and about 0.001 wt % to about 20 wt % of the organic acid.

The embodiments may be realized by providing a method of polishing a tungsten pattern wafer, the method comprising polishing a tungsten pattern wafer using the CMP slurry composition according to an embodiment.

DETAILED DESCRIPTION

Example embodiments will now be described more fully hereinafter; however, they may be embodied in different forms and should not be construed as limited to the embodiments set forth herein. Rather, these embodiments are provided so that this disclosure will be thorough and complete, and will fully convey exemplary implementations to those skilled in the art.

It will also be understood that when a layer or element is referred to as being "on" another layer or element, it can be directly on the other layer or element, or intervening layers may also be present.

As used herein, the term "substituted" in the term "substituted or unsubstituted" means that at least one hydrogen atom in a corresponding functional group is substituted with a hydroxyl group, a halogen, a $C_1$ to $C_{10}$ alkyl group or halo-alkyl group, a $C_2$ to $C_{10}$ alkenyl group or halo-alkenyl group, a $C_2$ to $C_{10}$ alkynyl group or halo-alkynyl group, a $C_3$ to $C_{10}$ cycloalkyl group, a $C_3$ to $C_{10}$ cycloalkenyl group, a $C_6$ to $C_{30}$ aryl group, a $C_7$ to $C_{30}$ arylalkyl group, a $C_1$ to $C_{10}$ alkoxy group, a $C_6$ to $C_{30}$ aryloxy group, an amino group, a cyano group, a nitro group, or a thiol group. As used herein, the term "or" is not an exclusive term, e.g., "A or B" would include A, B, or A and B.

Herein, "monovalent organic group" may mean a monovalent aliphatic hydrocarbon group, a monovalent alicyclic hydrocarbon group, or a monovalent aromatic hydrocarbon group (e.g., including at least one bonding location).

Herein, "monovalent aliphatic hydrocarbon group" may be a substituted or unsubstituted $C_1$ to $C_{20}$ linear or branched alkyl group, preferably a $C_1$ to $C_{10}$ alkyl group, more preferably a $C_1$ to $C_5$ alkyl group (e.g., including at least one bonding location).

Herein, "monovalent alicyclic hydrocarbon group" may be a substituted or unsubstituted $C_3$ to $C_{20}$ cycloalkyl group, preferably a $C_3$ to $C_{10}$ cycloalkyl group, more preferably a $C_3$ to $C_5$ cycloalkyl group (and including at least one bonding location).

Herein, "monovalent aromatic hydrocarbon group" may be a substituted or unsubstituted $C_6$ to $C_{30}$ aryl group or a substituted or unsubstituted $C_7$ to $C_{30}$ arylalkyl group, preferably a $C_6$ to $C_{10}$ aryl group or a $C_7$ to $C_{10}$ arylalkyl group (e.g., including at least one bonding location).

Herein, "bivalent organic group" may mean a bivalent aliphatic hydrocarbon group, a bivalent alicyclic hydrocarbon group, or a bivalent aromatic hydrocarbon group (e.g., including at least two bonding locations).

Herein, "bivalent aliphatic hydrocarbon group", "bivalent alicyclic hydrocarbon group" or "bivalent aromatic hydrocarbon group" may refer to a modified bivalent group of the "monovalent aliphatic hydrocarbon group", the "monovalent alicyclic hydrocarbon group", or the "monovalent aromatic hydrocarbon group".

For example, the "bivalent aliphatic hydrocarbon group" may be a substituted or unsubstituted $C_1$ to $C_{20}$ linear or branched alkylene group, preferably a $C_1$ to $C_{10}$ alkylene group, more preferably a $C_1$ to $C_5$ alkylene group; the "bivalent alicyclic hydrocarbon group" may be a substituted or unsubstituted $C_3$ to $C_{20}$ cycloalkylene group, preferably a $C_3$ to $C_{10}$ cycloalkylene group, more preferably a $C_3$ to $C_5$ cycloalkylene group; and the "bivalent aromatic hydrocarbon group" may be a substituted or unsubstituted $C_6$ to $C_{30}$ arylene group or a substituted or unsubstituted $C_7$ to $C_{30}$ arylalkylene group, preferably a $C_6$ to $C_{10}$ arylene group, or a $C_7$ to $C_{10}$ arylalkylene group (e.g., including at least two bonding locations).

As used herein to represent a specific numerical range, "X to Y" is defined as "greater than or equal to X and less than or equal to Y".

A CMP slurry composition for polishing a tungsten pattern wafer may help improve polishing rate and flatness of a tungsten pattern wafer when silica modified with a silane containing two nitrogen atoms or silica modified with a silane containing three nitrogen atoms is used as an abrasive agent in the CMP slurry composition. In an implementation, in the CMP slurry composition, a composition of Formula 3 may be used as a biocide to provide biocidal effects without deterioration in polishing rate and flatness due to the abrasive agent.

A CMP slurry composition for polishing a tungsten pattern wafer according to an (hereinafter, "CMP slurry composition") may include, e.g., a solvent (e.g., a polar solvent or a non-polar solvent); an abrasive agent; and a biocide. In an implementation, the abrasive agent may include, e.g., silica modified with a silane containing two nitrogen atoms or silica modified with a silane containing three nitrogen atoms. In an implementation, the biocide may include, e.g., a compound of Formula 3 described below.

Hereinafter, components of the CMP slurry composition according to an embodiment will be described in detail.

The solvent, e.g., a polar solvent or a non-polar solvent, may help reduce friction upon polishing a tungsten pattern wafer with an abrasive agent. The solvent may include, e.g., water (e.g., ultrapure water or deionized water), an organic amine, an organic alcohol, an organic alcohol amine, an organic ether, an organic ketone, or the like. In an implementation, ultrapure water or deionized water may be used. The solvent may be included in a balance amount in the CMP slurry composition.

Abrasive Agent

The abrasive agent may help polish an insulating layer (e.g., a silicon oxide layer) and a tungsten pattern wafer at a high polishing rate.

The abrasive agent may include, e.g., silica modified with a silane containing two nitrogen atoms and or silica modified with a silane containing three nitrogen atoms. The modified silica may include, e.g., spherical or non-spherical particles, in which primary particles may have an average particle diameter (D50) of about 10 nm to about 200 nm, e.g., about 20 nm to about 180 nm or about 30 nm to about 150 nm. Within this range, the CMP slurry composition may help secure a sufficient polishing rate of the insulating layer and the tungsten pattern wafer, which are polishing targets, without generating surface defects (e.g., scratches and the like) after polishing.

The "average particle diameter (D50)" means the diameter of particles corresponding to 50 wt % in a weight distribution of the abrasive agent.

In the CMP slurry composition, the abrasive agent, e.g., the silica modified with a silane containing two nitrogen or the silica modified with a silane containing three nitrogen atoms, may be present in an amount of, e.g., about 0.001 wt % to about 20 wt %, about 0.01 wt % to about 10 wt %, about 0.05 wt % to about 5 wt %, or about 0.1 wt % to about 3 wt % (e.g., based on a total weight of the CMP slurry composition). Within this range, the CMP slurry composition may help secure a sufficient polishing rate of the insulating layer and the tungsten pattern wafer while securing slurry dispersion stability without generating scratches.

In an implementation, the abrasive agent may be present in an amount of, e.g., about 0.001 wt %, 0.002 wt %, 0.003 wt %, 0.004 wt %, 0.005 wt %, 0.006 wt %, 0.007 wt %, 0.008 wt %, 0.009 wt %, 0.01 wt %, 0.02 wt %, 0.03 wt %, 0.04 wt %, 0.05 wt %, 0.06 wt %, 0.07 wt %, 0.08 wt %, 0.09 wt %, 0.1 wt %, 0.2 wt %, 0.3 wt %, 0.4 wt %, 0.5 wt %, 0.6 wt %, 0.7 wt %, 0.8 wt %, 0.9 wt %, 1 wt %, 2 wt %, 3 wt %, 4 wt %, 5 wt %, 6 wt %, 7 wt %, 8 wt %, 9 wt %, 10 wt %, 11 wt %, 12 wt %, 13 wt %, 14 wt %, 15 wt %, 16 wt %, 17 wt %, 18 wt %, 19 wt %, or 20 wt %, in the composition.

The abrasive agent may include the silica modified with a silane containing two nitrogen atoms and or the silica modified with a silane containing two nitrogen atoms. The modified silica may help achieve a remarkable improvement in polishing rate and flatness while suppressing generation of scratches, as compared with non-modified silica or silica modified with an amino silane containing one nitrogen atom. In an implementation, the modified silica may help realize a high polishing rate of the tungsten pattern wafer in a sub-acidic pH condition, as compared with in a strongly acidic condition.

The modified silica may have a positive charge on a surface thereof and may have a surface potential of about 10 mV to 60 mV. Within this range, the composition may help achieve improvement in flatness without generating surface defects after polishing.

In an implementation, silica may be modified with an amino silane containing two nitrogen atoms or an amino silane containing three nitrogen atoms, described below in detail.

The silica modified with a silane containing two nitrogen atoms or a silane containing three nitrogen atoms may be obtained by adding a modification target compound, a cation thereof, or a salt thereof to non-modified silica, followed by reaction for a predetermined period of time. The non-modified silica may include, e.g., colloidal silica or fumed silica. In an implementation, the non-modified silica may include, e.g., colloidal silica.

Silane Containing Two Nitrogen Atoms

The silane containing two nitrogen atoms may include, e.g., a compound of Formula 1, a cation derived from the compound of Formula 1, or a salt of the compound of Formula 1.

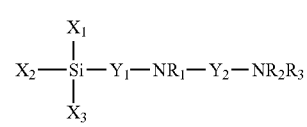

[Formula 1]

In Formula 1, $X_1$, $X_2$, and $X_3$ may independently be or include, e.g., a hydrogen atom, a hydroxyl group, a substituted or unsubstituted $C_1$ to $C_{20}$ alkyl group, a substituted or unsubstituted $C_6$ to $C_{20}$ aryl group, a substituted or unsubstituted $C_3$ to $C_{20}$ cycloalkyl group, a substituted or unsubstituted $C_7$ to $C_{20}$ arylalkyl group, a substituted or unsubstituted $C_1$ to $C_{20}$ alkoxy group, or a substituted or unsubstituted $C_6$ to $C_{20}$ aryloxy group. In an implementation, at least one of $X_1$, $X_2$ and $X_3$ may be, e.g., a hydroxyl group, a substituted or unsubstituted $C_1$ to $C_{20}$ alkoxy group, or a substituted or unsubstituted $C_6$ to $C_{20}$ aryloxy group.

$Y_1$ and $Y_2$ may each independently be, e.g., a bivalent aliphatic hydrocarbon group, a bivalent alicyclic hydrocarbon group, or a bivalent aromatic hydrocarbon group.

$R_1$, $R_2$ and $R_3$ may independently be or include, e.g., a hydrogen atom, a hydroxyl group, a substituted or unsubstituted $C_1$ to $C_{20}$ monovalent aliphatic hydrocarbon group, a substituted or unsubstituted $C_3$ to $C_{20}$ monovalent alicyclic hydrocarbon group, or a substituted or unsubstituted $C_6$ to $C_{30}$ monovalent aromatic hydrocarbon group.

In an implementation, the abrasive agent may include silica modified with the compound of Formula 1.

In an implementation, in Formula 1, $X_1$, $X_2$ and $X_3$ may independently be or include, e.g., a hydroxyl group, a substituted or unsubstituted $C_1$ to $C_{20}$ alkyl group, or a substituted or unsubstituted $C_1$ to $C_{20}$ alkoxy group. In an implementation, at least one of $X_1$, $X_2$ and $X_3$ may be, e.g., a hydroxyl group or a substituted or unsubstituted $C_1$ to $C_{20}$ alkoxy group. In an implementation, in Formula 1, $X_1$, $X_2$ and $X_3$ may each independently be, e.g., a hydroxyl group or a substituted or unsubstituted $C_1$ to $C_{20}$ alkoxy group. With this structure, the compound of Formula 1 may be more stably coupled to silica, thereby increasing lifespan of the abrasive agent.

In an implementation, $Y_1$ and $Y_2$ may each independently be, e.g., a bivalent aliphatic hydrocarbon group. In an implementation, $Y_1$ and $Y_2$ may each independently be, e.g., a $C_1$ to $C_5$ alkylene group.

In an implementation, in Formula 1, $R_1$, $R_2$, and $R_3$ may each be a hydrogen atom. In this case, the compound of Formula 1 may be amino group ($-NH_2$)-containing silane.

In an implementation, the compound of Formula 1 may include, e.g., aminoethylaminopropyltrimethoxysilane, aminoethylaminopropyltriethoxysilane, aminoethylaminopropylmethyldimethoxysilane, aminoethylaminopropylmethyldimethoxysilane, aminoethylaminomethyltriethoxysilane, or aminoethylaminomethylmethyldiethoxysilane.

In an implementation, the abrasive agent may include, e.g., silica modified with a cation derived from the compound of Formula 1.

The cation derived from the compound of Formula 1 means a cation formed by coupling a hydrogen atom or a substituent to at least one of two nitrogen atoms in the compound of Formula 1. The cation may include a monovalent or bivalent cation. In an implementation, the cation may be represented by, e.g., Formula 1-1, Formula 1-2, or Formula 1-3.

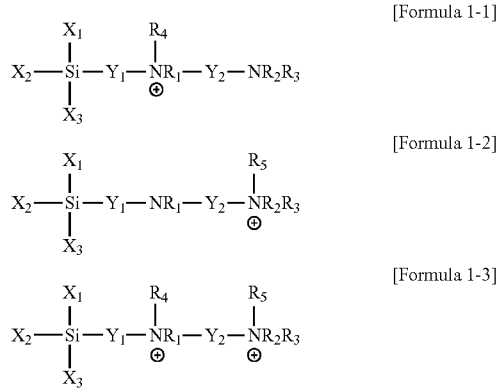

In Formulae 1-1 to 1-3, $X_1$, $X_2$, $X_3$, $Y_1$, $Y_2$, $R_1$, $R_2$, and $R_3$ may be defined the same as those of Formula 1.

$R_4$ and $R_5$ may each independently be, e.g., a hydrogen atom, a hydroxyl group, a substituted or unsubstituted $C_1$ to $C_{20}$ monovalent aliphatic hydrocarbon group, a substituted or unsubstituted $C_3$ to $C_{20}$ monovalent alicyclic hydrocarbon group, or a substituted or unsubstituted $C_6$ to $C_{30}$ monovalent aromatic hydrocarbon group.

In an implementation, the abrasive agent may include silica modified with a salt of the compound of Formula 1. The salt of the compound of Formula 1 means a neutral salt of a cation and an anion derived from the compound of Formula 1.

The cation may be represented by, e.g., Formula 1-1, Formula 1-2, or Formula 1-3. The anion may include a halogen anion (e.g.: $F^-$, $Cl^-$, $Br^-$, or $I^-$); an organic acid anion, such as a carbonic anion (e.g.: $CO_3^{2-}$, $HCO_3^-$), an acetic anion ($CH_3COO^-$), a citric anion ($HOC(COO^-)(CH_2COO^-)_2$), or the like; a nitrogen-containing anion (e.g.: $NO_3^-$, $NO_2^-$); a phosphorus-containing anion (e.g.: $PO_4^{3-}$, $HPO_4^{2-}$, $H_2PO_4^-$); a sulfur-containing anion (e.g.: $SO_4^{2-}$, $HSO_4^-$); an inorganic acid anion, such as a cyanide anion ($CN^-$), or the like.

Silane Containing Three Nitrogen Atoms

The silane containing three nitrogen atoms may include, e.g., a compound of Formula 2, a cation derived from the compound of Formula 2, or a salt of the compound of Formula 2.

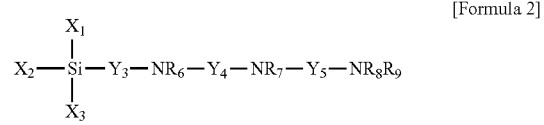

In Formula 2, $X_1$, $X_2$, and $X_3$ may be defined the same as those of Formula 1.

$Y_3$, $Y_4$, and $Y_5$ may each independently be, e.g., a single bond, a bivalent aliphatic hydrocarbon group, a bivalent alicyclic hydrocarbon group, or a bivalent aromatic hydrocarbon group.

$R_6$, $R_7$, $R_8$ and $R_9$ may each independently be, e.g., a hydrogen atom, a hydroxyl group, a substituted or unsubstituted $C_1$ to $C_{20}$ monovalent aliphatic hydrocarbon group, a substituted or unsubstituted $C_3$ to $C_{20}$ monovalent alicyclic hydrocarbon group, or a substituted or unsubstituted $C_6$ to $C_{30}$ monovalent aromatic hydrocarbon group.

In an implementation, the abrasive agent may include, e.g., silica modified with the compound of Formula 2.

In an implementation, in Formula 2, $X_1$, $X_2$ and $X_3$ may each independently be, e.g., a hydroxyl group, a substituted or unsubstituted $C_1$ to $C_{20}$ alkyl group, or a substituted or unsubstituted $C_1$ to $C_{20}$ alkoxy group. In an implementation, at least one of $X_1$, $X_2$ and $X_3$ may be, e.g., a hydroxyl group or a substituted or unsubstituted $C_1$ to $C_{20}$ alkoxy group. In an implementation, in Formula 2, $X_1$, $X_2$ and $X_3$ may each independently be, e.g., a hydroxyl group or a substituted or unsubstituted $C_1$ to $C_{20}$ alkoxy group. With this structure, the compound of Formula 2 may be more stably coupled to silica, thereby increasing lifespan of the abrasive agent.

In an implementation, in Formula 2, $Y_3$, $Y_4$ and $Y_5$ may each independently be, e.g., a bivalent aliphatic hydrocarbon group. In an implementation, in Formula 2, $Y_3$, $Y_4$ and $Y_5$ may each independently be, e.g., a $C_1$ to $C_5$ alkylene group.

In an implementation, in Formula 2, $R_6$, $R_7$, $R_8$ and $R_9$ may each be a hydrogen atom. In this case, the compound of Formula 2 may be, e.g., an amino group ($-NH_2$)-containing silane.

In an implementation, the compound of Formula 2 may include, e.g., diethylenetriaminopropyltrimethoxysilane, diethylenetriaminopropyltriethoxysilane, diethylenetriaminopropylmethyldimethoxysilane, diethylenetriaminopropylmethyldiethoxysilane, or diethylenetriaminomethylmethyldiethoxysilane.

In an implementation, the abrasive agent may include, e.g., silica modified with a cation derived from the compound of Formula 2. With this structure, the modified silica may have a positive charge on the surface thereof, thereby achieving improvement in polishing rate and flatness without generation of scratches.

The cation derived from the compound of Formula 2 means a cation formed by coupling a hydrogen atom or a substituent to a nitrogen atom in the compound of Formula 2. The cation may include a monovalent to trivalent cation. In an implementation, the cation may be represented by one of Formula 2-1 to Formula 2-7.

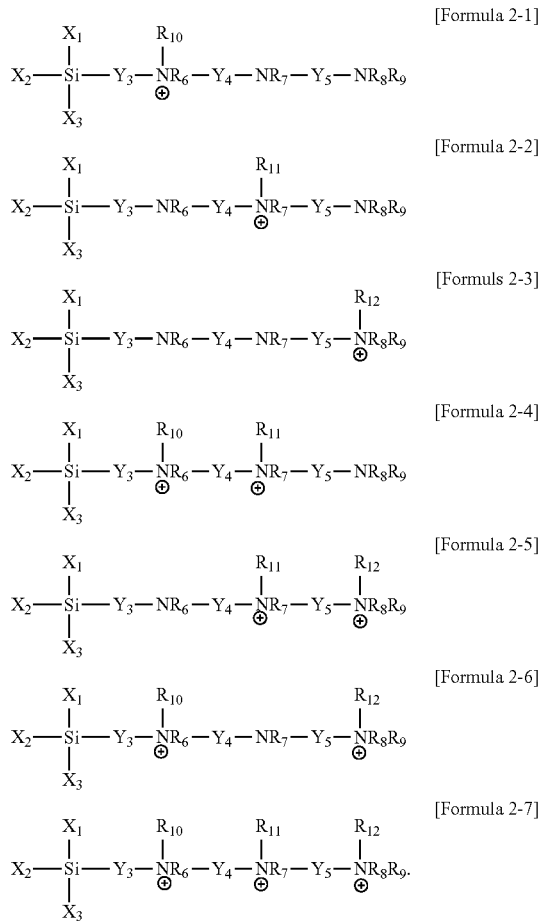

In Formulae 2-1 to 2-7, $X_1$, $X_2$, $X_3$, $Y_3$, $Y_4$, $Y_5$, $R_6$, $R_7$, $R_8$, and $R_9$ may be defined the same as those of Formula 2.

$R_{10}$, $R_{11}$, and $R_{12}$ may each independently be, e.g., a hydrogen atom, a hydroxyl group, a substituted or unsubstituted $C_1$ to $C_{20}$ monovalent aliphatic hydrocarbon group, a substituted or unsubstituted $C_3$ to $C_{20}$ monovalent alicyclic hydrocarbon group, or a substituted or unsubstituted $C_6$ to $C_{30}$ monovalent aromatic hydrocarbon group.

In an implementation, the abrasive agent may include, e.g., silica modified with a salt of the compound of Formula 2. The salt of the compound of Formula 2 means a neutral salt of a cation and an anion derived from the compound of Formula 2.

The cation may be represented by, e.g., one of Formulae 2-1 to 2-7. The anion may include the same anion as the anion in the salt of Formula 1 or a different anion from the anion therein.

Biocide

With the modified silica as the abrasive agent, the CMP slurry composition may help increase the polishing rate of the tungsten pattern wafer while improving flatness on a polishing surface of the tungsten pattern wafer. In the CMP slurry composition, however, the modified silica could undergo a deterioration in stability of the CMP slurry composition due to growth of microorganisms including, e.g., fungi and/or bacteria, as the pH of the CMP slurry composition increases from a strongly acidic condition to a sub-acidic pH condition. Such a phenomenon could cause filter clogging upon filtration of the composition and contamination of a semiconductor fabrication facility in a semiconductor manufacturing process.

In an implementation, a compound of Formula 3 may be included as a biocide, and the CMP slurry composition may maintain polishing performance at substantially the same level as a CMP slurry composition not containing the biocide, by suppressing growth of microorganisms including, e.g., fungi and/or bacteria without deterioration in improvement of the polishing rate and flatness of the tungsten pattern wafer achieved by the modified silica.

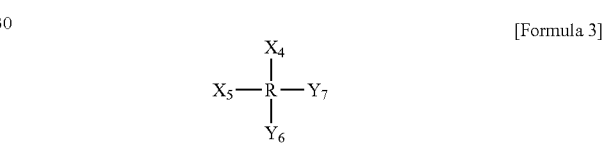

In Formula 3, R may be, e.g., carbon (C) or a bivalent to tetravalent organic group (e.g., if $Y_6$ and/or $Y_7$ are hydrogen, R may be considered bivalent, trivalent, or tetravalent).

$X_4$ may be, e.g., a halogen or a halogen-containing monovalent organic group.

$X_5$ may be, e.g., a cyano group (—C≡N), a nitro group (—NO$_2$), a cyano group-containing monovalent organic group, or a nitro group-containing monovalent organic group.

$Y_6$ and $Y_7$ may each independently be, e.g., a hydrogen atom, a halogen, a cyano group, a nitro group, a hydroxyl group, a substituted or unsubstituted $C_1$ to $C_{20}$ alkyl group, a substituted or unsubstituted $C_6$ to $C_{20}$ aryl group, a substituted or unsubstituted $C_3$ to $C_{20}$ cycloalkyl group, a substituted or unsubstituted $C_7$ to $C_{20}$ arylalkyl group, a substituted or unsubstituted $C_1$ to $C_{20}$ alkoxy group, a substituted or unsubstituted $C_6$ to $C_{20}$ aryloxy group, or —C(=O)—NZ$_1$Z$_2$, in which $Z_1$ and $Z_2$ may each independently be, e.g., a hydrogen atom, a substituted or unsubstituted $C_1$ to $C_{20}$ alkyl group, or a substituted or unsubstituted $C_6$ to $C_{20}$ aryl group.

In an implementation, in Formula 3, the halogen may be F, Cl, Br or I, e.g., Br.

In an implementation, in R of Formula 3, the bivalent or tetravalent organic group may be, e.g., a $C_2$ to $C_{20}$ linear or branched alkylene group or a $C_6$ to $C_{10}$ arylene group.

In an implementation, in Formula 3, the monovalent organic group may be, e.g., a $C_1$ to $C_{20}$ alkyl group or a $C_6$ to $C_{20}$ aryl group.

In an implementation, the biocide may include, e.g., a compound of Formula 4.

[Formula 4]

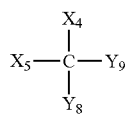

In Formula 4, $X_4$ and $X_5$ may be defined the same as those of Formula 3.

$Y_8$ and $Y_9$ may each independently be, e.g., a hydrogen atom, a halogen, a cyano group, a nitro group, a hydroxyl group, a substituted or unsubstituted $C_1$ to $C_{20}$ alkyl group, or —C(=O)—$NZ_1Z_2$, in which $Z_1$ and $Z_2$ may each independently be, e.g., a hydrogen atom, a substituted or unsubstituted $C_1$ to $C_{20}$ alkyl group, or a substituted or unsubstituted $C_6$ to $C_{20}$ aryl group.

In an implementation, in Formula 4, $Y_8$ and $Y_9$ may each independently be, e.g., a halogen, a cyano group, a nitro group, a hydroxyl group, a cyano group-substituted $C_1$ to $C_{20}$ alkyl group, a nitro group-substituted $C_1$ to $C_{20}$ alkyl group, a halogen-substituted $C_1$ to $C_{20}$ alkyl group, a hydroxyl group-substituted $C_1$ to $C_{20}$ alkyl group, or —C(=O)—$NZ_1Z_2$, in which $Z_1$ and $Z_2$ may each independently be, e.g., a hydrogen atom, a substituted or unsubstituted $C_1$ to $C_{20}$ alkyl group, or a substituted or unsubstituted $C_6$ to $C_{20}$ aryl group.

Each of $X_4$, $X_5$, $Y_6$, and $Y_7$ in Formula 3 and each of $X_4$, $X_5$, $Y_6$ and $Y_7$ in Formula 4 may be adjusted to realize the desirable effects of the embodiments.

The compound of Formula 3 may be a compound of, e.g., Formula 7, Formula 8, or Formula 9.

[Formula 7]

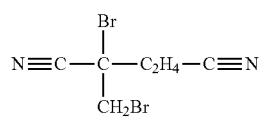

[Formula 8]

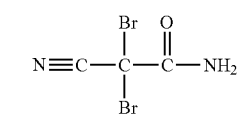

[Formula 9]

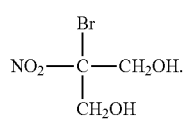

The compound of Formula 3 or Formula 4 may be prepared by a suitable method or obtained from commercially available products.

In the CMP slurry composition, the biocide may be present in an amount of, e.g., about 0.001 wt % to about 1 wt %, about 0.001 wt % to about 0.5 wt %, about 0.001 wt % to about 0.1 wt %, or about 0.01 wt % to about 0.1 wt %. Within this range, the CMP slurry composition may help achieve improvement in polishing rate and flatness while suppressing growth of microorganisms including, e.g., fungi and/or bacteria.

In an implementation, the biocide may be present in an amount of, e.g., about 0.001 wt %, 0.002 wt %, 0.003 wt %, 0.004 wt %, 0.005 wt %, 0.006 wt %, 0.007 wt %, 0.008 wt %, 0.009 wt %, 0.01 wt %, 0.02 wt %, 0.03 wt %, 0.04 wt %, 0.05 wt %, 0.06 wt %, 0.07 wt %, 0.08 wt %, 0.09 wt %, 0.1 wt %, 0.2 wt %, 0.3 wt %, 0.4 wt %, 0.5 wt %, 0.6 wt %, 0.7 wt %, 0.8 wt %, 0.9 wt %, or 1 wt % in the CMP slurry composition.

In an implementation, the CMP slurry composition may further include, e.g., an oxidizing agent, a catalyst, or an organic acid.

The oxidizing agent may serve to oxidize the tungsten pattern wafer to facilitate polishing of the tungsten pattern wafer.

The oxidizing agent may include, e.g., an inorganic per compound, an organic per compound, bromic acid or salts thereof, nitric acid or salts thereof, chloric acid or salts thereof, chromic acid or salts thereof, iodic acid or salts thereof, iron or salts thereof, copper or salts thereof, rare earth metal oxides, transition metal oxides, or potassium dichromate. Here, the "per compound" refers to a compound that contains at least one peroxide group (—O—O—) or an element in the highest oxidation state. In an implementation, the oxidizing agent may include a per compound. In an implementation, the per compound may include, e.g., hydrogen peroxide, potassium periodide, calcium persulfate, or potassium ferricyanide. In an implementation, the per compound may include, e.g., hydrogen peroxide. In an implementation, the oxidizing agent may be added to the CMP slurry composition immediately before polishing with the composition.

In the CMP slurry composition, the oxidizing agent may be present in an amount of, e.g., about 0.01 wt % to about 20 wt %, about 0.05 wt % to about 10 wt %, or about 0.1 wt % to about 5 wt %. Within this range, the CMP slurry composition may help improve the polishing rate of the tungsten pattern wafer. In an implementation, the oxidizing agent may be present in an amount of, e.g., about 0.01 wt %, 0.02 wt %, 0.03 wt %, 0.04 wt %, 0.05 wt %, 0.06 wt %, 0.07 wt %, 0.08 wt %, 0.09 wt %, 0.1 wt %, 0.2 wt %, 0.3 wt %, 0.4 wt %, 0.5 wt %, 0.6 wt %, 0.7 wt %, 0.8 wt %, 0.9 wt %, 1 wt %, 2 wt %, 3 wt %, 4 wt %, 5 wt %, 6 wt %, 7 wt %, 8 wt %, 9 wt %, 10 wt %, 11 wt %, 12 wt %, 13 wt %, 14 wt %, 15 wt %, 16 wt %, 17 wt %, 18 wt %, 19 wt %, or 20 wt %, in the CMP slurry composition.

In an implementation, the CMP slurry composition may further include, e.g., an iron ion compound, a complex compound of iron ions, or a hydrate thereof, as the catalyst.

The iron ion compound, the complex compound of iron ions, and the hydrate thereof may help improve the polishing rate of the tungsten pattern wafer.

The iron ion compound may include an iron trivalent cation-containing compound. The iron trivalent cation-containing compound may include a compound having iron trivalent cations, which are present as free cations in an aqueous solution. In an implementation, the iron trivalent cation-containing compound may include, e.g., iron chloride ($FeCl_3$), iron nitrate ($Fe(NO_3)_3$), or iron sulfate ($Fe_2(SO_4)_3$).

The complex compound of iron ions may include an iron trivalent cation-containing complex compound. The iron trivalent cation-containing complex compound may include a compound or a salt thereof formed by reacting an iron trivalent cation with an organic or inorganic compound having a functional group, e.g., carboxylic acids, phosphoric acids, sulfuric acids, amino acids, or amines in an aqueous solution. In an implementation, the organic or inorganic compound may include, e.g., citrate, ammonium citrate, p-toluene sulfonic acid (pTSA), 1,3-propylenediaminetetraacetic acid (PDTA), ethylenediaminetetraacetic acid (EDTA), diethylenetriaminepentaacetic acid (DTPA), nitrilotriacetic acid (NTA), and ethylenediamine-N,N'-disuccinic acid (EDDS). Examples of the iron trivalent cation-containing compound may include ferric citrate, ferric ammonium citrate, Fe(III)-pTSA, Fe(III)-PDTA, and Fe(III)-EDTA.

In the CMP slurry composition, the catalyst, e.g., the iron ion compound, the complex compound of iron ions, or the hydrate thereof, may be present in an amount of, e.g., about 0.001 wt % to about 10 wt %, about 0.001 wt % to about 5 wt %, about 0.001 wt % to about 1 wt %, or about 0.001 wt % to about 0.5 wt %. Within this range, the CMP slurry composition may help improve the polishing rate of a tungsten layer.

In an implementation, in the CMP slurry composition, the catalyst, e.g., the iron ion compound, the complex compound of iron ions, or the hydrate thereof, may be present in an amount of, e.g., about 0.001 wt %, 0.002 wt %, 0.003 wt %, 0.004 wt %, 0.005 wt %, 0.006 wt %, 0.007 wt %, 0.008 wt %, 0.009 wt %, 0.01 wt %, 0.02 wt %, 0.03 wt %, 0.04 wt %, 0.05 wt %, 0.06 wt %, 0.07 wt %, 0.08 wt %, 0.09 wt %, 0.1 wt %, 0.2 wt %, 0.3 wt %, 0.4 wt %, 0.5 wt %, 0.6 wt %, 0.7 wt %, 0.8 wt %, 0.9 wt %, 1 wt %, 2 wt %, 3 wt %, 4 wt %, 5 wt %, 6 wt %, 7 wt %, 8 wt %, 9 wt %, or 10 wt %.

The organic acid may include, e.g., a polycarboxylic acid, such as malonic acid, maleic acid, malic acid, or the like, or an amino acid, such as glycine, isoleucine, leucine, phenylalanine, methionine, threonine, tryptophan, valine, alanine, arginine, cysteine, glutamine, histidine, proline, serine, tyrosine, and lysine, or the like.

In the CMP slurry composition, the organic acid may be present in an amount of, e.g., about 0.001 wt % to about 20 wt %, about 0.01 wt % to about 10 wt %, about 0.01 wt % to about 5 wt %, or about 0.01 wt % to about 1 wt %. Within this range, the CMP slurry composition may help suppress erosion and protrusion upon polishing the tungsten pattern wafer. In an implementation, in the CMP slurry composition, the organic acid may be present in an amount of, e.g., about 0.001 wt %, 0.002 wt %, 0.003 wt %, 0.004 wt %, 0.005 wt %, 0.006 wt %, 0.007 wt %, 0.008 wt %, 0.009 wt %, 0.01 wt %, 0.02 wt %, 0.03 wt %, 0.04 wt %, 0.05 wt %, 0.06 wt %, 0.07 wt %, 0.08 wt %, 0.09 wt %, 0.1 wt %, 0.2 wt %, 0.3 wt %, 0.4 wt %, 0.5 wt %, 0.6 wt %, 0.7 wt %, 0.8 wt %, 0.9 wt %, 1 wt %, 2 wt %, 3 wt %, 4 wt %, 5 wt %, 6 wt %, 7 wt %, 8 wt %, 9 wt %, 10 wt %, 11 wt %, 12 wt %, 13 wt %, 14 wt %, 15 wt %, 16 wt %, 17 wt %, 18 wt %, 19 wt %, or 20 wt %.

The CMP slurry composition may have a pH of, e.g., about 3 to about 6, about 4 to about 6, or about 5 to about 6. Within this range, the CMP slurry composition containing the modified silica as the abrasive agent may realize a high polishing rate of the tungsten pattern wafer upon polishing in a sub-acidic pH condition, as compared with in a strongly acidic condition. In an implementation, the CMP slurry composition may have a pH of, e.g., about 3, 3.1, 3.2, 3.3, 3.4, 3.5, 3.6, 3.7, 3.8, 3.9, 4, 4.1, 4.2, 4.3, 4.4, 4.5, 4.6, 4.7, 4.8, 4.9, 5, 5.1, 5.2, 5.3, 5.4, 5.5, 5.6, 5.7, 5.8, 5.9, or 6.

In an implementation, the CMP slurry composition may further include, e.g., a pH regulator to help maintain a suitable pH value.

In an implementation, the pH regulator may include an inorganic acid, e.g., nitric acid, phosphoric acid, hydrochloric acid, or sulfuric acid, or an organic acid, e.g., an organic acid having a pKa value of about 6 or less, such as acetic acid and phthalic acid. The pH regulator may include a base, e.g., an ammonia solution, sodium hydroxide, potassium hydroxide, ammonium hydroxide, sodium carbonate, or potassium carbonate.

In an implementation, the CMP slurry composition may further include a suitable additive, e.g., a surfactant, a dispersant, a modifier, a surface active agent, or the like. In the CMP slurry composition, the additives may be present in an amount of, e.g., about 0.001 wt % to about 5 wt %, about 0.001 wt % to about 1 wt %, or about 0.001 wt % to about 0.5 wt %. Within this range, the additives may help realize effects thereof without adversely affecting the polishing rate. In an implementation, in the CMP slurry composition, the additives may be present in an amount of, e.g., about 0.001 wt %, 0.002 wt %, 0.003 wt %, 0.004 wt %, 0.005 wt %, 0.006 wt %, 0.007 wt %, 0.008 wt %, 0.009 wt %, 0.01 wt %, 0.02 wt %, 0.03 wt %, 0.04 wt %, 0.05 wt %, 0.06 wt %, 0.07 wt %, 0.08 wt %, 0.09 wt %, 0.1 wt %, 0.2 wt %, 0.3 wt %, 0.4 wt %, 0.5 wt %, 0.6 wt %, 0.7 wt %, 0.8 wt %, 0.9 wt %, 1 wt %, 2 wt %, 3 wt %, 4 wt %, or 5 wt %.

A method of polishing a tungsten pattern wafer according to an embodiment may include, e.g., polishing a tungsten pattern wafer using the CMP slurry composition according to an embodiment.

The following Examples and Comparative Examples are provided in order to highlight characteristics of one or more embodiments, but it will be understood that the Examples and Comparative Examples are not to be construed as limiting the scope of the embodiments, nor are the Comparative Examples to be construed as being outside the scope of the embodiments. Further, it will be understood that the embodiments are not limited to the particular details described in the Examples and Comparative Examples.

Details of components used in Examples and Comparative Examples are as follows.
(1) Non-modified abrasive agent: Colloidal silica having an average particle diameter (D50) of 120 nm (PL-7, Fuso Chemical Industries)
(2) pH regulator: nitric acid or ammonia solution Example 1

In terms of solid content of the non-modified abrasive agent, 0.04 mmol of a compound of Formula 5 was mixed with the non-modified abrasive agent and reacted under conditions of pH 2.5 at 25° C. for 72 hours, thereby preparing silica modified with the compound of Formula 5.

[Formula 5]

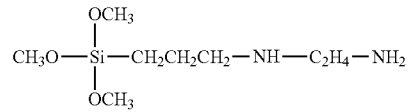

A CMP slurry composition was prepared by mixing 1.5 wt % of the modified silica as an abrasive agent, 0.03 wt % of malonic acid and 0.15 wt % of glycine as organic acids, 0.001 wt % of iron nitrate nonahydrate as an iron ion-containing compound, 0.001 wt % of ethylenediaminetetraacetic acid diammonium, 0.01 wt % of the compound of Formula 7 as a biocide, and a balance of deionized water, all wt % being based on the total weight of the CMP slurry composition. The CMP slurry composition was regulated to a pH of 5.5 using a pH regulator. As an oxidizing agent, hydrogen peroxide was mixed in an amount of 0.3 wt % based on the total weight of the CMP slurry composition immediately before polishing.

Example 2

In terms of solid content of a non-modified abrasive agent, 0.04 mmol of a compound of Formula 6 was mixed with the non-modified abrasive agent and reacted under conditions of pH 2.5 and 25° C. for 72 hours, thereby preparing modified silica as the compound of Formula 6.

[Formula 6]

$$CH_3O-\underset{\underset{OCH_3}{|}}{\overset{\overset{OCH_3}{|}}{Si}}-CH_2CH_2CH_2-NH-C_2H_4-NH-C_2H_4-NH_2$$

A CMP slurry composition was prepared in the same manner as in Example 1 using the modified silica of Formula 6.

Examples 3 to 5

CMP slurry compositions for polishing a tungsten pattern wafer were prepared in the same manner as in Example 1 except that the kind and content of biocide were changed as listed in Table 1.

Comparative Example 1

A CMP slurry composition for polishing a tungsten pattern wafer was prepared in the same manner as in Example 1 except that the compound of Formula 7 was not included.

Comparative Examples 2 to 6

CMP slurry compositions for polishing a tungsten pattern wafer were prepared in the same manner as in Example 1 except that the kind and content of biocide were changed as listed in Table 1.

The biocides used in the Examples and Comparative Examples are shown in the following.

Formula 7

$$N\equiv C-\underset{\underset{CH_2Br}{|}}{\overset{\overset{Br}{|}}{C}}-C_2H_4-C\equiv N$$

1,2-dibromo-2,4-dicyanobutane
(Manufacturer: Ah Sung Fine Chemical Limited Company)

Formula 8

$$N\equiv C-\underset{\underset{Br}{|}}{\overset{\overset{Br}{|}}{C}}-\overset{\overset{O}{\|}}{C}-NH_2$$

2,2-dibromo-3-nitrilopropionamide
(Manufacturer: DuPont)

Formula 9

$$NO_2-\underset{\underset{Br}{|}}{\overset{\overset{Br}{|}}{C}}-CH_2OH$$

2-bromo-2-nitropropane-1,3-diol
(Manufacturer: DuPont)

Formula 10

$$H-\overset{\overset{O}{\|}}{C}-CH_2CH_2CH_2-\overset{\overset{O}{\|}}{C}-H$$

glutaraldehyde
(Manufactuer: DuPont)

Formula 11 phenoxy ethanol
(Manufacturer: Sigma Aldrich)

Formula 12

2-octyl-2H-isothiazol-3-one
(Manufacturer: DuPont)

Formula 13 o-phenyl phenol
(Manufacturer: Ah Sung Fine Chemical Limited Company)

Formula 14

$$C_4H_9-NH-\overset{\overset{O}{\|}}{C}-O-CH_2-C\equiv C-I$$

3-iodopropynyl butyl carbamate
(Manufacturer: Sigma Aldrich)

(1) Suppression of microorganism and fungi was evaluated on the CMP slurry compositions prepared in the Examples and Comparative Examples under the following polishing conditions. Results are shown in Table 1.

Fungi contamination area and microorganism contamination area (unit: %): A mixture prepared by stirring 1,000 g of the CMP slurry composition prepared in each of the Examples and Comparative Examples at 2,000 rpm in a 2 L flask for 2 hours and dispersed by a high pressure dispersion method, thereby preparing a slurry. A sample was prepared by filtering the slurry through a filter having a pore size of 0.2 μm.

After contaminating the prepared sample with *Aspergillus niger*, 0.5 ml of the sample was cultivated on a Potato Dextrose Agar medium (PDA medium, 3M) at 40° C. for 10 days, followed by calculating a ratio (%) of the total area of the cultivated fungi to the total area of the medium as the fungi contamination area.

After contaminating the prepared sample with bacteria or other microorganism (*Staphylococcus aureus, Candida albicans*), 0.5 ml of the sample was cultivated on a Plate Count Agar medium (PDA medium, 3M) at 40° C. for 10 days, followed by calculating a ratio (%) of the total area of the cultivated microorganism to the total area of the medium as the microorganism contamination area.

(2) Polishing evaluation was carried out on the CMP slurry compositions prepared in the Examples and Comparative Examples under the following polishing conditions. Results are shown in Table 1.
[Polishing Evaluation Condition]
1. Polishing machine: Reflexion 300 mm (AMAT Co., Ltd.)
2. Polishing condition
Polishing pad: VP3100/Rohm and Haas Company
Head speed: 35 rpm
Platen speed: 33 rpm
Pressure: 1.5 psi
Retainer Ring Pressure: 8 psi
Slurry flow rate: 250 ml/min
Polishing time: 60 sec
3. Polishing target
A commercially available tungsten pattern wafer (MIT 854, 300 mm) was used.
A mixture was prepared by mixing a CMP slurry for tungsten polishing (STARPLANAR7000, Samsung SDI Co., Ltd.) with deionized water in a weight ratio of 1:2, and hydrogen peroxide was added to the mixture in an amount of 2 wt % based on the weight of the mixture, thereby preparing a mixed solution, which in turn was used to polish a tungsten pattern wafer. The tungsten pattern wafer was polished on a polishing machine (Reflexion LK300 mm) using an IC1010/SubaIV Stacked polishing pad (Rodel Co., Ltd.) for 60 seconds under conditions of a head speed of 101 rpm, a platen speed of 33 rpm, a polishing pressure of 2 psi, a retainer ring pressure of 8 psi, and a mixed solution flow rate of 250 ml/min. Polishing was performed to remove a tungsten metal layer until oxide/metal patterns were exposed.
4. Analysis method
Relative oxide polishing rate (unit: %): An oxide polishing rate (unit: Å/min) was obtained based on a difference in film thickness before and after polishing, as measured using a reflectometer under the above polishing conditions.
The composition of Comparative Example 1 had an oxide polishing rate of 120 Å/min (which served as a reference polishing rate).
Relative oxide polishing rate was calculated by the following equation: {(oxide polishing rate in application of compositions of each of the Examples and Comparative Examples)/(oxide polishing rate in application of composition of Comparative Example 1)}×100.

Relative Flatness (unit: %): After polishing a wafer using the CMP slurry compositions prepared in each of the Examples and Comparative Examples under the above polishing conditions, a profile of a pattern was measured using an Insight CAP Compact Atomic Profiler (Bruker Co., Ltd.). Erosion (unit: Å) was calculated based on a difference in height between peri-oxide and cell-oxide in a 0.18/0.18 μm pattern region of the polished wafer. A scanning speed was set to 100 μm/sec and a scan length was set to 2 mm.

The composition of Comparative Example 1 had an erosion of 50 Å (which served as a reference erosion).

Relative flatness was calculated by the following equation: {(erosion in application of composition of each of Examples and Comparative Examples)/(erosion in application of composition of Comparative Example 1)}×100

TABLE 1

|  | Amino group-containing silane | Biocide Kind | Biocide Content (wt %) | Fungi contamination area | Microorganism contamination area (*Staphylococcus aureus*) | Microorganism contamination area (*Candida albicans*) | Relative oxide polishing rate | Relative flatness |
|---|---|---|---|---|---|---|---|---|
| Example 1 | Formula 5 | Formula 7 | 0.01 | <1% | <1% | <1% | 101 | 102 |
| Example 2 | Formula 6 | Formula 7 | 0.01 | <1% | <1% | <1% | 99 | 100 |
| Example 3 | Formula 5 | Formula 7 | 0.05 | <1% | <1% | <1% | 99 | 103 |
| Example 4 | Formula 5 | Formula 8 | 0.03 | <1% | <1% | <1% | 96 | 98 |
| Example 5 | Formula 5 | Formula 9 | 0.05 | <1% | <1% | <1% | 102 | 96 |
| Comparative Example 1 | Formula 5 | — | — | 52% | 24% | 29% | 100 | 100 |
| Comparative Example 2 | Formula 5 | Formula 10 | 0.1 | <1% | <1% | <1% | 77 | 294 |
| Comparative Example 3 | Formula 5 | Formula 11 | 0.5 | <1% | <1% | <1% | 110 | 307 |
| Comparative Example 4 | Formula 5 | Formula 12 | 0.03 | 22% | 12% | 11% | 92 | 226 |
| Comparative Example 5 | Formula 5 | Formula 13 | 0.05 | <1% | 8% | 9% | 96 | 251 |
| Comparative Example 6 | Formula 5 | Formula 14 | 0.01 | <1% | <1% | <1% | 85 | 456 |

As may be seen in Table 1, the CMP slurry composition according to the Examples achieved an improvement in stability of the composition with respect to fungi and other microorganisms by suppressing growth of the fungi and other microorganisms. In addition, the CMP slurry composition according to the Examples suffered from no or only insignificant deterioration in improvement in polishing rate and flatness of the tungsten pattern wafer, as compared with a CMP slurry composition free from the biocide.

On the contrary, the composition of Comparative Example 1 containing no biocide was unsuitable due to excessive growth of fungi and other microorganisms. In addition, the composition of each of Comparative Examples 2 to 6 prepared using biocides other than the compound of Formula 3 exhibited insignificant biocidal effects and/or no or insignificant improvement in polishing rate and flatness of the tungsten pattern wafer, as compared with a CMP slurry composition free from the biocide.

One or more embodiments may provide a CMP slurry composition for polishing a tungsten pattern wafer, which may help improve polishing rate and flatness of a tungsten pattern wafer while also improving stability with respect to microorganisms including, e.g., fungi and/or bacteria.

By way of summation and review, although some CMP slurry compositions may be used immediately after preparation thereof, some CMP slurry compositions may not be used immediately after preparation due to preparation, delivery, or the like. As a result, propagation of microorganisms could occur during a storage period of the CMP slurry composition, thereby causing, e.g., filter clogging upon filtration of the CMP slurry composition or deterioration in processability due to contamination of a semiconductor manufacturing facility.

One or more embodiments may provide a CMP slurry composition for polishing a tungsten pattern wafer, which has improved stability with respect to microorganisms including, e.g., fungi and/or bacteria.

One or more embodiments may provide a CMP slurry composition for polishing a tungsten pattern wafer, which may help improve polishing rate and flatness of a tungsten pattern wafer upon polishing of the tungsten pattern wafer.

Example embodiments have been disclosed herein, and although specific terms are employed, they are used and are to be interpreted in a generic and descriptive sense only and not for purpose of limitation. In some instances, as would be apparent to one of ordinary skill in the art as of the filing of the present application, features, characteristics, and/or elements described in connection with a particular embodiment may be used singly or in combination with features, characteristics, and/or elements described in connection with other embodiments unless otherwise specifically indicated. Accordingly, it will be understood by those of skill in the art that various changes in form and details may be made without departing from the spirit and scope of the present invention as set forth in the following claims.

What is claimed is:
1. A CMP slurry composition for polishing a tungsten pattern wafer, the CMP slurry composition comprising:
a solvent, the solvent being a polar solvent or a non-polar solvent;
about 0.001 wt % to about 20 wt % of an abrasive agent;
about 0.001 wt % to about 10 wt % of a catalyst;
about 0.001 wt % to about 20 wt % of an organic acid; and
about 0.001 wt % to about 1 wt % of a biocide,
wherein:
the abrasive agent includes silica modified with a silane containing two nitrogen atoms or silica modified with a silane containing three nitrogen atoms,
the biocide includes a compound of Formula 4:

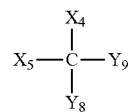

[Formula 4]

in Formula 4,
$X_4$ is a halogen or a halogen-containing monovalent organic group;
$X_5$ is a cyano group (—C≡N), a nitro group (—NO$_2$), a cyano group-containing monovalent organic group, or a nitro group-containing monovalent organic group, and
$Y_8$ and $Y_9$ are each independently a hydrogen atom, a halogen, a cyano group, a nitro group, a hydroxyl group, a substituted or unsubstituted $C_1$ to $C_{20}$ alkyl group, or —C(=O)—NZ$_1$Z$_2$, in which $Z_1$ and $Z_2$ are each independently a hydrogen atom, a substituted or unsubstituted $C_1$ to $C_{20}$ alkyl group, or a substituted or unsubstituted $C_6$ to $C_{20}$ aryl group, the silane containing two nitrogen atoms includes a compound of Formula 1, a cation derived from the compound of Formula 1, or a salt of the compound of Formula 1:

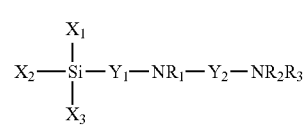

[Formula 1]

in Formula 1,
$X_1$, $X_2$ and $X_3$ are each independently a hydrogen atom, a hydroxyl group, a substituted or unsubstituted $C_1$ to $C_{20}$ alkyl group, a substituted or unsubstituted $C_6$ to $C_{20}$ aryl group, a substituted or unsubstituted $C_3$ to $C_{20}$ cycloalkyl group, a substituted or unsubstituted $C_7$ to $C_{20}$ arylalkyl group, a substituted or unsubstituted $C_1$ to $C_{20}$ alkoxy group, or a substituted or unsubstituted $C_6$ to $C_{20}$ aryloxy group, at least one of $X_1$, $X_2$ and $X_3$ being a hydroxyl group, a substituted or unsubstituted $C_1$ to $C_{20}$ alkoxy group, or a substituted or unsubstituted $C_6$ to $C_{20}$ aryloxy group;
$Y_1$ and $Y_2$ are each independently a bivalent aliphatic hydrocarbon group, a bivalent alicyclic hydrocarbon group, or a bivalent aromatic hydrocarbon group; and
$R_1$, $R_2$ and $R_3$ are each independently a hydrogen atom, a hydroxyl group, a substituted or unsubstituted $C_1$ to $C_{20}$ monovalent aliphatic hydrocarbon group, a substituted or unsubstituted $C_3$ to $C_{20}$ monovalent alicyclic hydrocarbon group, or a substituted or unsubstituted $C_6$ to $C_{30}$ monovalent aromatic hydrocarbon group,
the silane containing three nitrogen atoms includes a compound of Formula 2, a cation derived from the compound of Formula 2, or a salt of the compound of Formula 2:

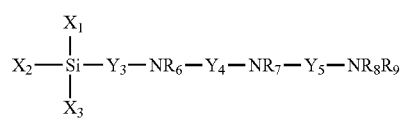

[Formula 2]

in Formula 2,
$X_1$, $X_2$ and $X_3$ are each independently a hydrogen atom, a hydroxyl group, a substituted or unsubstituted $C_1$ to $C_{20}$ alkyl group, a substituted or unsubstituted $C_6$ to $C_{20}$ aryl group, a substituted or unsubstituted $C_3$ to $C_{20}$ cycloalkyl group, a substituted or unsubstituted $C_7$ to $C_{20}$ arylalkyl group, a substituted or unsubstituted $C_1$ to $C_{20}$ alkoxy group, or a substituted or unsubstituted $C_6$ to $C_{20}$ aryloxy group, at least one of $X_1$, $X_2$ and $X_3$ being a hydroxyl group, a substituted or unsubstituted $C_1$ to $C_{20}$ alkoxy group, or a substituted or unsubstituted $C_6$ to $C_{20}$ aryloxy group;
$Y_3$, $Y_4$ and $Y_5$ are each independently a single bond, a bivalent aliphatic hydrocarbon group, a bivalent alicyclic hydrocarbon group, or a bivalent aromatic hydrocarbon group; and
$R_6$, $R_7$, $R_8$ and $R_9$ are each independently a hydrogen atom, a hydroxyl group, a substituted or unsubstituted $C_1$ to $C_{20}$ monovalent aliphatic hydrocarbon group, a substituted or unsubstituted $C_3$ to $C_{20}$ monovalent alicyclic hydrocarbon group, or a substituted or unsubstituted $C_6$ to $C_{30}$ monovalent aromatic hydrocarbon group.

2. The CMP slurry composition as claimed in claim 1, wherein the compound of Formula 4 includes a compound of Formula 7, Formula 8, or Formula 9:

[Formula 7]
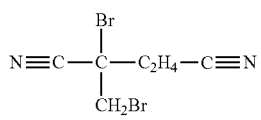

[Formula 8]
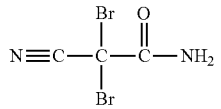

[Formula 9]
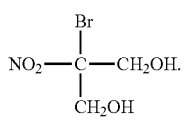

3. The CMP slurry composition as claimed in claim 1, wherein the CMP slurry composition has a pH of about 3 to about 6.

4. The CMP slurry composition as claimed in claim 1, further comprising an oxidizing agent.

5. The CMP slurry composition as claimed in claim 4, wherein the CMP slurry composition includes:

about 0.01 wt % to about 20 wt % of the oxidizing agent.

6. The CMP slurry composition as claimed in claim 1, wherein the biocide is present in an amount of 0.001 wt % to 0.03 wt %, based on a total weight of the CMP slurry composition.

7. A method of polishing a tungsten pattern wafer, the method comprising polishing a tungsten pattern wafer using the CMP slurry composition as claimed in claim 1.

8. The method as claimed in claim 7, wherein the CMP slurry composition has a pH of about 3 to about 6.

* * * * *